(12) United States Patent
Jain et al.

(10) Patent No.: US 9,252,118 B2
(45) Date of Patent: Feb. 2, 2016

(54) CMOS-COMPATIBLE GOLD-FREE CONTACTS

(75) Inventors: Siddharth Jain, Santa Barbara, CA (US); John Bowers, Santa Barbara, CA (US); Matthew Sysak, Sunnyvale, CA (US); John Heck, Berkeley, CA (US); Ran Feldesh, Gan Yavne (IL); Richard Jones, San Mateo, CA (US); Yoel Shetrit, Kfar Ben-Nun (IL); Michael Geva, Sierra Madre, CA (US)

(73) Assignees: INTEL CORPORATION, Santa Clara, CA (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 13/995,689
(22) PCT Filed: Dec. 22, 2011
(86) PCT No.: PCT/US2011/066907
§ 371 (c)(1),
(2), (4) Date: Jun. 19, 2013
(87) PCT Pub. No.: WO2013/095523
PCT Pub. Date: Jun. 27, 2013

(65) Prior Publication Data
US 2014/0050243 A1 Feb. 20, 2014

(51) Int. Cl.
*H01S 5/042* (2006.01)
*H01L 23/00* (2006.01)
(Continued)

(52) U.S. Cl.
CPC .......... *H01L 24/45* (2013.01); *H01L 21/28575* (2013.01); *H01L 21/8258* (2013.01); *H01L 21/823814* (2013.01);
(Continued)

(58) Field of Classification Search
CPC ............................ H01S 5/0425; H01L 29/452
See application file for complete search history.

(56) References Cited

U.S. PATENT DOCUMENTS 4,011,583 A * 3/1977 Levinstein et al. ............ 257/743
4,989,065 A * 1/1991 Tsuchimoto et al. ......... 257/750
(Continued)

FOREIGN PATENT DOCUMENTS

JP 5326928 12/1993
JP 629517 2/1994
(Continued)

OTHER PUBLICATIONS

Chin et al., "In Situ Surface Passivation and CMOS-Compatible Palladium—Germanium Contacts for Surface-Channel Gallium Arsenide MOSFETs," Jun. 2006, IEEE Electron Device Letters, vol. 29, No. 6, 553-556.*

(Continued)

*Primary Examiner* — Joshua King
(74) *Attorney, Agent, or Firm* — Blakely, Sokoloff, Taylor & Zafman LLP

(57) ABSTRACT

A semiconductor metallurgy includes a ratio of germanium and palladium that provides low contact resistance to both n-type material and p-type material. The metallurgy allows for a contact that does not include gold and is compatible with mass-production CMOS techniques. The ratio of germanium and palladium can be achieved by stacking layers of the materials and annealing the stack, or simultaneously depositing the germanium and palladium on the material where the contact is to be manufactured.

15 Claims, 6 Drawing Sheets

(51) Int. Cl.
- *H01L 21/8238* (2006.01)
- *H01L 21/8258* (2006.01)
- *H01L 21/285* (2006.01)
- *H01L 29/45* (2006.01)
- *H01L 27/12* (2006.01)
- *H01L 29/20* (2006.01)
- *H01S 5/02* (2006.01)

(52) U.S. Cl.
CPC ..... *H01L 21/823871* (2013.01); *H01L 29/452* (2013.01); *H01L 27/1203* (2013.01); *H01L 29/20* (2013.01); *H01L 2924/01006* (2013.01); *H01L 2924/01015* (2013.01); *H01S 5/021* (2013.01); *H01S 5/0425* (2013.01)

(56) References Cited

U.S. PATENT DOCUMENTS

| | | | |
|---|---|---|---|
| 5,045,502 | A | 9/1991 | Lau et al. |
| 5,104,848 | A * | 4/1992 | Miedema et al. ............. 505/191 |
| 5,480,829 | A | 1/1996 | Abrokwah et al. |
| 6,103,614 | A * | 8/2000 | Ahmari et al. ............... 438/606 |
| 7,368,822 | B2 * | 5/2008 | Lee et al. ...................... 257/742 |
| 7,405,125 | B2 | 7/2008 | Wang |
| 7,420,227 | B2 | 9/2008 | Chang et al. |
| 2004/0105471 | A1 * | 6/2004 | Kneissl et al. ................. 372/36 |
| 2005/0105869 | A1 | 5/2005 | Forbes et al. |
| 2006/0153262 | A1 * | 7/2006 | Barbieri et al. ............ 372/43.01 |
| 2007/0170417 | A1 | 7/2007 | Bowers |
| 2009/0239354 | A1 * | 9/2009 | Suzawa et al. ................ 438/458 |
| 2010/0142580 | A1 * | 6/2010 | Gilet et al. ................. 372/50.11 |
| 2011/0274130 | A1 * | 11/2011 | Abeles et al. ............. 372/45.01 |
| 2014/0307997 | A1 | 10/2014 | Bar et al. |

FOREIGN PATENT DOCUMENTS

| | | | | |
|---|---|---|---|---|
| JP | 08222526 | A * | 8/1996 | ............. H01L 21/28 |
| JP | 2010-263029 | | 11/2010 | |

OTHER PUBLICATIONS

Wang et al., "Thermal Stability of Pd/Ge-Based Ohmic Contacts to n-type GaAs," Aug. 1, 1998, Journal of Applied Physics, vol. 84, No. 3, 1310-1315.*

Baca et al., "A Survey of Ohmic Contacts to III-V Compound Semiconductors," 1997, Thin Solid Films, 308-309, 599-606.*

Machac et al., "Improvement of Ge/Pd/GaAs Ohmic Contact by in Layer," 2007, J. Mater Sci: Mater Electron, 18, 621-625.*

Office Action and Taiwan Search Report from foreign counterpart Taiwan Patent Application No. 101146186, mailed Sep. 25, 2014, 17 pages.

International Preliminary Report on Patentability for International Patent Application No. PCT/US2011/066907, mailed Jul. 3, 2014, 8 pages.

Machac, et al., "Improvement of Ge/Pd/GaAs ohmic contact by in layer", Journal of Materials Science: Materials in Electronics, vol. 18, Issue 6, Jun. 2007, 2 pages.

International Search Report and Written Opinion from PCT/US2011/066907 mailed Sep. 24, 2012, 11 pages.

P. Longo, et al. "A TEM nanoanalytical investigation of Pd/Ge ohmic contacts for the miniaturization and optimization of n-InGaAs MOSFET devices", *Electron Microscopy and Analysis and Group Conference 2009 (EMAG 2009)*, *Journal of Physics: Conference Seri*.

Chen, W. L., et al., "Ohmic Contact Study for Quantum Effect Transistors & Heterojunction Bipolar Transistors with InGaAs Contact Layers", *J. Vac. Sci. Technol. B*, vol. 10, No. 6, Nov./Dec/ 1992.

Grenouillet, L., et al., "CMOS Compatible Contacts & Etching for InP-on-silicon Active Devices", *CEA-LETI-Minatec, IEEE*, 2009.

Jian, Ping, et al., "Ohmic Contact Formation in Palladium-Based Metallizations to n-Type InP", Univ. of Alberta, *Journal of Electronic Materials*, vol. 23, No. 9, 1994.

"Notice of Allowance for Taiwan Patent Application No. 101146186", (Dec. 31, 2014), pp. 2.

International Search Report and Written Opinion for International Application No. PCT/US2011/066255 dated Sep. 3, 2012, 6 pages.

International Preliminary Report on Patentability for International Application No. PCT/US2011/066255 dated Jun. 24, 2014, 4 pages.

* cited by examiner

CMOS-COMPATIBLE GOLD-FREE CONTACTS

STATEMENT OF GOVERNMENT LICENSE RIGHTS

This invention was made with Government support under contract number H98230-10-9-0021 awarded by the Department of Defense. The Government has certain rights in this invention. This invention was made with Government support under Grant No. W911NF-04-9-0001, awarded by the Army Research Office. The Government has certain rights in this invention.

This application is a U.S. National Phase application under 35 U.S.C. §371 of International Application No. PCT/US11/66907 filed Dec. 22, 2011, and claims the benefit of priority of that International Application.

FIELD

Embodiments of the invention are generally related to semiconductor processing, and more particularly to gold-free semiconductor device contacts.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2011, Intel Corporation, All Rights Reserved.

BACKGROUND

Integrated circuits (I/Cs) include contacts to provide electrical connectivity to operate the integrated circuit devices. The contacts are typically made of metal that has good conductivity, such as copper, aluminum, or gold. Copper and aluminum are used frequently in circuits based on silicon, whereas gold is commonly used in circuits based on compound semiconductors (III-V materials.) Gold provides low contact resistance for III-V materials. Copper and aluminum do not generally form low-resistance contacts with III-V materials as well as gold.

However, gold is a contaminant in any fab or facility that uses CMOS (complementary Metal-oxide-semiconductor) processing. CMOS processing typically uses silicon, and gold diffuses very well into silicon, even from underneath a wafer being processed. The diffusion of gold into the silicon allows electrons to get into the semiconductor band gap, which contaminates the resulting transistor or other I/C device structures, causing circuit failure. Thus, gold cannot be used in any equipment used in the large-scale CMOS processing (such as a fab).

Other materials that can be used to make contacts in processes compatible with CMOS processing equipment do not have the low contact resistance of gold. Thus, the material with the desired contact properties and low contact resistance (gold) is not compatible with large-scale, mass production processing techniques that would be used to make I/Cs needing such contacts.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As described herein, a semiconductor metallurgy includes a ratio of germanium and palladium that provides low contact resistance to both n-type material and p-type material. The metallurgy allows for a contact that does not include gold and is compatible with mass-production CMOS techniques. The ratio of germanium and palladium can be achieved by stacking layers of the materials and annealing the stack, or simultaneously depositing the germanium and palladium on the material where the contact is to be manufactured.

The palladium (Pd) and germanium (Ge) material allows for good adherence to all parts of an I/C, such as an oxide material (e.g., $SiO2$ or silicon-dioxide), an n-type material (i.e., a semiconductor material that has been doped with a material to increase the free negative charge carriers (electrons)), or a p-type materials (i.e., a semiconductor material that has been doped with a material to increase the free positive charge carriers (holes)). In one embodiment, the thickness ratio of Ge to Pd is within a range of approximately 1.25-2.0 parts Ge per part Pd. This corresponds to an approximate Pd:Ge atomic ratio of 0.77-1.23.

Figure 1:
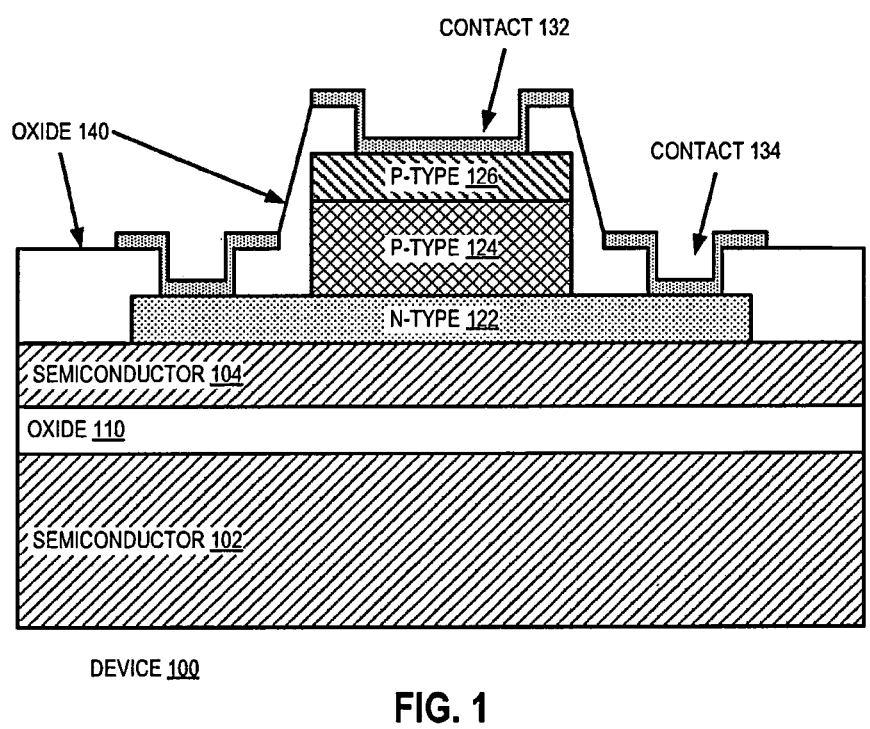
FIG. 1 is a block diagram of an embodiment of a laser device having gold-free contacts.

FIG. 1 is a block diagram of an embodiment of a laser device having gold-free contacts. Device 100 includes a Ge—Pd based CMOS-compatible contact structure. The specific cross section shown illustrates a hybrid laser device. Device 100 can be any type of integrated circuit device. In one embodiment, the structure of device 100 is achieved by process flows performed after the laser structure is defined on the semiconductor substrate. Semiconductor 102 is a wafer, and will typically be silicon. Oxide 110 represents a buried oxide layer under another layer of semiconductor 104 on which the circuitry is processed, for example, a configuration used in a SOI (silicon-on-insulator) wafer.

The III-V structure includes n-type material 122 adjacent to or contacting semiconductor layer 104, followed vertically away from the wafer by p-type material 124 and p-type material 126. As is understood in the art, p-type material 124 and p-type material 126 can have different doping and/or be different types of materials to achieve the desired laser performance. Again, while a hybrid laser is shown, the laser structure could be replaced by other circuit components on which a gold-free contact could be used.

Figure 2A:
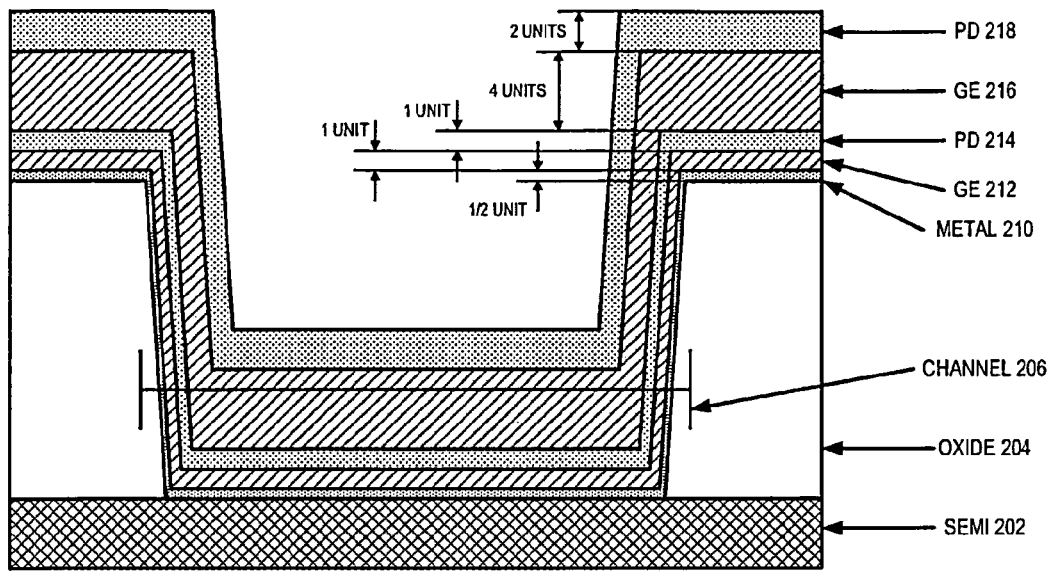
FIG. 2A is a block diagram of an embodiment of a layered gold-free contact having a germanium layer closest to the semiconductor to contact.
Figure 2B:
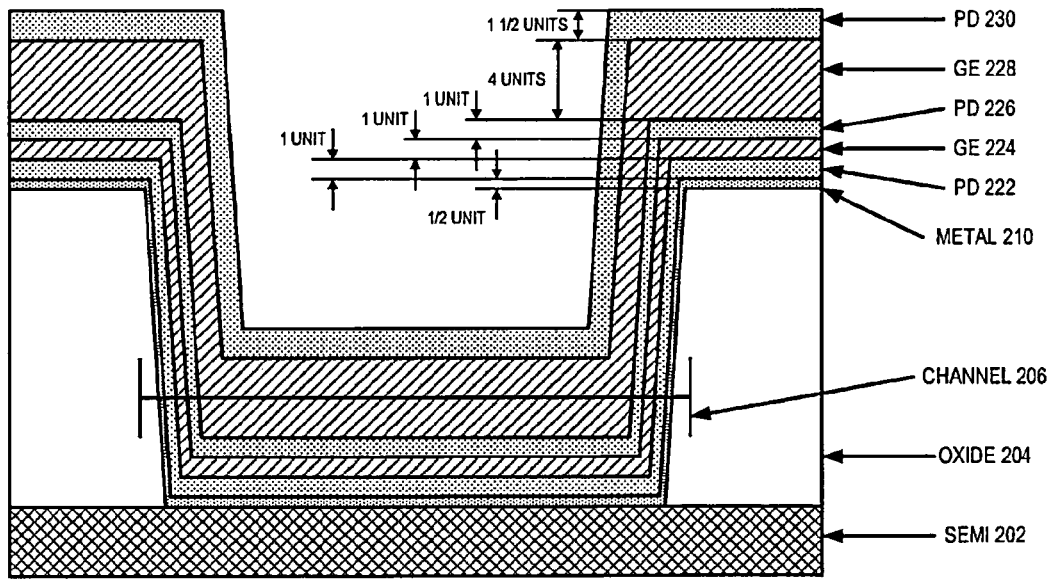
FIG. 2B is a block diagram of an embodiment of a layered gold-free contact having a palladium layer closest to the semiconductor to contact.
Figure 3:
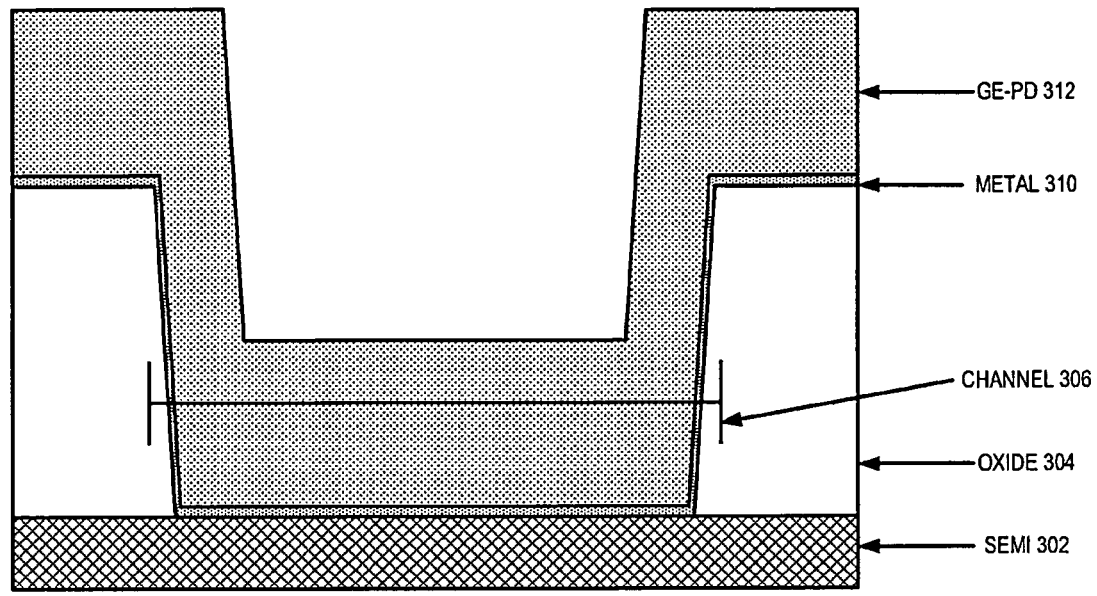
FIG. 3 is a block diagram of an embodiment of a gold-free contact having a germanium-palladium material manufactured onto a contact area.

In one embodiment, a cladding oxide layer 140 is deposited (e.g., approximately 1 μm PECVD (plasma-enhanced chemical vapor deposition) oxide), and contact vias are etched into the oxide. The contact vias are cleaned, such as by wet chemistry (e.g., dilute HF (hydroflouric) and/or in-situ Ar soft-sputter etching). The contacts (e.g., contacts 132, 134) can then be processed into the contact vias. FIGS. 2A, 2B, and 3 below show different techniques for processing the gold-free contacts.

The commonality of each of the approaches is that a combination of Ge and Pd are processed into the contact vias, and the contacts are then patterned, for example by plasma etching or wet chemical etching. The etching stops on the oxide layer. The Ge—Pd structure adheres well to p-type material 126, n-type material 122, as well as oxide 140. Thus, the structure has electrical control terminals provided by the contacts to control operation of the circuit of device 100.

The III-V semiconductor material has a region of p-type material exposed through the oxide and a region of n-type material exposed through the oxide; by the processing, on which a contact is manufactured for each. The ratio of Ge to Pd provides a low contact resistance for both the p-type material and n-type material, as explained in more detail below.

FIG. 2A is a block diagram of an embodiment of a layered gold-free contact having a germanium layer closest to the semiconductor to contact. Device 200 can be any device on which a gold-free contact would be manufactured. Device 200 can be one example of device 100 of FIG. 1. Semiconductor 202 can be any type of semiconductor device to which a contact may be attached. For example, semiconductor 202 can be a p-type material, or an n-type material, whether in a III-V structure, or some other semiconductor.

Oxide 204 is manufactured over the top of semiconductor 202. The manufacturing process then creates channel 206 in oxide 204 using known techniques. The contact is formed onto semiconductor 202 in channel 206. In one embodiment as shown, the Ge—Pd contact is formed by layering the two materials in sequence, starting with Ge. While four layers are shown, it will be understood that more or fewer layers of material can be used. Using more than two layers is preferred, seeing that the two materials will mix better during annealing if more layers are used. However, if manufacturing techniques improve to where thin enough layers can be used that would allow good integration of the materials in annealing with just two layers, then one layer of each material could be used.

Example layer thicknesses are provided for reference only, and are not to be understood as limiting in any way. In the drawing, generic relative thicknesses are provided, with examples of practical thicknesses being provided below. In one embodiment, Ge layer 212 is approximately 1 unit thick, Pd layer 214 is approximately 1 unit thick, Ge layer 216 is approximately 4 units thick, and Pd layer 218 is approximately 2 units thick. The total ratio of Ge to Pd is (4+1) to (1+2) or 5:3, corresponding to a Pd:Ge atomic ratio of 0.92.

As mentioned above, the layer thicknesses are selected to allow the materials to mix well during anneal. Example thicknesses are 1 unit to anywhere in the range of approximately 5-30 nm. In one embodiment, 1 unit is 10 nm. There is not a reason to believe that the physics of the combining of the materials would work differently with thinner layers. However, the thicknesses described are based on practical limitations of good deposition with current techniques. With current techniques, layers thinner than about 5 nm are not uniform in thickness due to the practical mechanical limitations of the semiconductor processing. To the extent that improved processing becomes available, unit thicknesses of less than 5 nm should be possible.

With an example of 1 unit as 10 nm, the contact structure includes a stack consisting of 10 nm Ge, 10 nm Pd, 40 nm Ge, and 20 nm Pd, which can be deposited by sputtering. Such a stack could be annealed at 350° C. for 30 seconds (or another temperature and time combination based on layer thicknesses). Whatever the actual process used, the annealing is to cause interdiffusion of the Pd and Ge. In one embodiment, the annealing can also provide some doping effect of Ge in an n-InP layer to reduce contact resistance (Re).

In one embodiment, a layer of metal is deposited between the contact stack and the surface to be contacted (i.e., semiconductor 202). Examples can include tungsten or titanium. Thus, metal layer 210 of approximately ½ a unit can be provided in device 200. Metal layer 210 is optional, and will not be used in all implementations. The metal can provide a diffusion barrier for the bottom layer, or the layer of the stack closest to the material for which a contact is being provided.

FIG. 2B is a block diagram of an embodiment of a layered gold-free contact having a palladium layer closest to the semiconductor to contact. Device 250 can be any device on which a gold-free contact would be manufactured. Device 250 can be one example of device 100 of FIG. 1. Semiconductor 202 can be any type of semiconductor device to which a contact may be attached. For example, semiconductor 202 can be a p-type material, or an n-type material, whether in a III-V structure, or some other semiconductor.

Oxide 204 is manufactured over the top of semiconductor 202. The manufacturing process then creates channel 206 in oxide 204 using known techniques. The contact is formed onto semiconductor 202 in channel 206. In one embodiment as shown, the Ge—Pd contact is formed by layering the two materials in sequence, starting with Pd. While five layers are shown, it will be understood that more or fewer layers of material can be used, as discussed above. It will be understood that Ge oxidizes, whereas Pd does not. Thus, there is an advantage in having Pd be the top layer, whether starting with Ge or Pd. As shown in FIG. 2B, the bottom most layer of the stack is Pd, and the top layer is also Pd.

Example layer thicknesses are provided for reference only, and are not to be understood as limiting in any way. In the drawing, generic relative thicknesses are provided, with examples of practical thicknesses being provided below. In one embodiment, Pd layer 222 is approximately 1 unit thick, Ge layer 224 is approximately 1 unit thick, Pd layer 226 is approximately 1 unit thick, Ge layer 228 is approximately 4 units thick, and Pd layer 230 is approximately 1½ units thick. The total ratio of Ge to Pd is (4+1) to (1+1+1½) or 5:3.5.

As mentioned above, the layer thicknesses are selected to allow the materials to mix well during anneal. Example thicknesses are 1 unit to anywhere in the range of approximately 5-30 nm. In one embodiment, 1 unit is 10 nm. With an example of 1 unit as 10 nm, the contact structure includes a stack consisting of 10 nm Pd, 10 nm Ge, 10 nm Pd, 40 nm Ge, and 15 nm Pd. The stack is then annealed to cause interdiffusion.

In one embodiment, a layer of metal is deposited between the contact stack and the surface to be contacted (i.e., semiconductor 202). Examples can include tungsten or titanium. Thus, metal layer 210 of approximately ½ a unit can be provided in device 250. Again, metal layer 210 is optional, and will not be used in all implementations. The metal can provide a diffusion barrier for the bottom layer, or the layer of the stack closest to the material for which a contact is being provided. It will be understood that the top metal layer is too thin to wirebond directly to it. Thus, in one embodiment, a thicker layer of metal (e.g., ~1-3 um) such as aluminum is deposited to allow wirebonding.

As mentioned above, in one embodiment, Pd is provided as the top layer of the contact stack, regardless of whether the stack begins with Pd or Ge. The top Pd layer provides a good sticking layer to the contact stack to allow the metal, such as aluminum or copper to adhere well to the contact.

FIG. 3 is a block diagram of an embodiment of a gold-free contact having a germanium-palladium material manufactured onto a contact area. While FIG. 2A shows a contact stack with Ge and Pd interlayered starting with Ge, and FIG. 2B shows a contact stack with Ge and Pd interlayered starting with Pd, in device 300, the contact stack is manufactured with the desired proportion of Ge to Pd. Thus, whereas in devices 200 and 250 the layers provided a ratio of Ge to Pd that is then annealed, in device 300 the Ge—Pd material is manufactured directly onto the contact area.

Similar to the structures of devices 200 and 250, device 300 can be any device on which a gold-free contact would be manufactured. Device 300 can be one example of device 100 of FIG. 1. Semiconductor 302 can be any type of semiconductor device to which a contact may be attached. For example, semiconductor 302 can be a p-type material, or an n-type material, whether in a III-V structure, or some other semiconductor.

Oxide 304 is manufactured over the top of semiconductor 302. The manufacturing process then creates channel 306 in oxide 304 using known techniques. The contact is formed onto semiconductor 302 in channel 306. In one embodiment as shown, the Ge—Pd contact is formed by manufacturing Ge—Pd layer 312 in channel 306. In one embodiment, Ge—Pd layer 312 can be formed by depositing a target material that has the desired ratio of Ge to Pd. Thus, the Ge—Pd target can be preformed with the desired ratio of Ge to Pd.

In one embodiment, Ge—Pd layer 312 can be formed by simultaneously depositing the layer of material from at least one Ge target and at least one Pd target. In one embodiment a Ge sputter target is used first to deposit a layer, followed by using a Pd sputter target to deposit a layer to provide the desired ratio.

In one embodiment, a layer of metal is deposited between the contact material and the surface to be contacted (i.e., semiconductor 302). Examples can include tungsten or titanium. Metal layer 310 is optional and will not be used in all implementations. Thus, metal layer 310 can be provided in device 300 between semiconductor 302 and contact material Ge—Pd 312.

Figure 4:
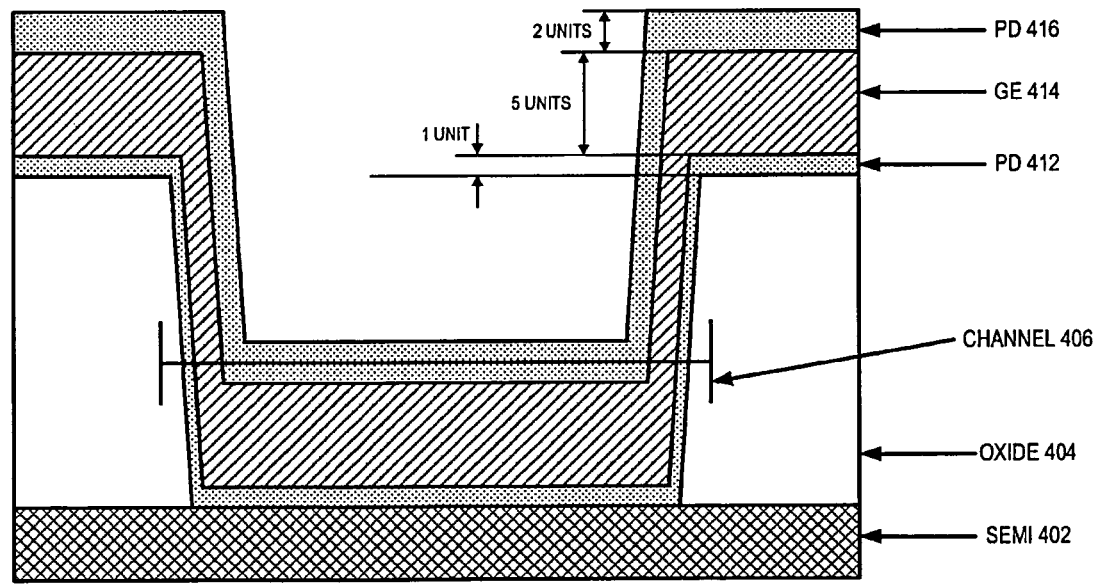
FIG. 4 is a block diagram of an embodiment of a three-layered gold-free contact having a palladium layer closest to the semiconductor to contact.

FIG. 4 is a block diagram of an embodiment of a three-layered gold-free contact having a palladium layer closest to the semiconductor to contact. Device 400 can be any device on which a gold-free contact would be manufactured. Device 400 can be one example of device 100 of FIG. 1. Semiconductor 402 can be any type of semiconductor device to which a contact may be attached. For example, semiconductor 402 can be a p-type material, or an n-type material, whether in a III-V structure, or some other semiconductor.

Oxide 404 is manufactured over the top of semiconductor 402. The manufacturing process then creates channel 406 in oxide 404 using known techniques. The contact is formed onto semiconductor 402 in channel 406. In one embodiment as shown, the Ge—Pd contact is formed by layering the two materials in sequence, starting with Pd. Three layers are shown, but more or fewer layers of material can be used, as discussed above. It will be understood that Ge oxidizes, whereas Pd does not. Thus, there is an advantage in having Pd be the top layer, whether starting with Ge or Pd. As shown in FIG. 4, the bottom most layer of the stack is Pd, and the top layer is also Pd.

Example layer thicknesses are provided for reference only, and are not to be understood as limiting in any way. In the drawing, generic relative thicknesses are provided, with examples of practical thicknesses being provided below. In one embodiment, Pd layer 412 is approximately 1 unit thick, Ge layer 414 is approximately 5 units thick, and Pd layer 416 is approximately 2 units thick. The total ratio of Ge to Pd is 5:3.

As mentioned above, the layer thicknesses are selected to allow the materials to mix well during anneal. Example thicknesses are 1 unit to anywhere in the range of approximately 5-30 nm. In one embodiment, 1 unit is 10 nm. With an example of 1 unit as 10 nm, the contact structure includes a stack consisting of 10 nm Pd, 50 nm Ge, and 20 nm Pd. The stack is then annealed to cause interdiffusion.

While an optional metal layer is shown in FIGS. 2A, 2B, and 3 are shown, there is no metal layer in between the contact stack and the surface to be contacted (i.e., semiconductor 402). While a layer of metal can provide a diffusion layer, it is not used in all embodiments.

Figure 5:
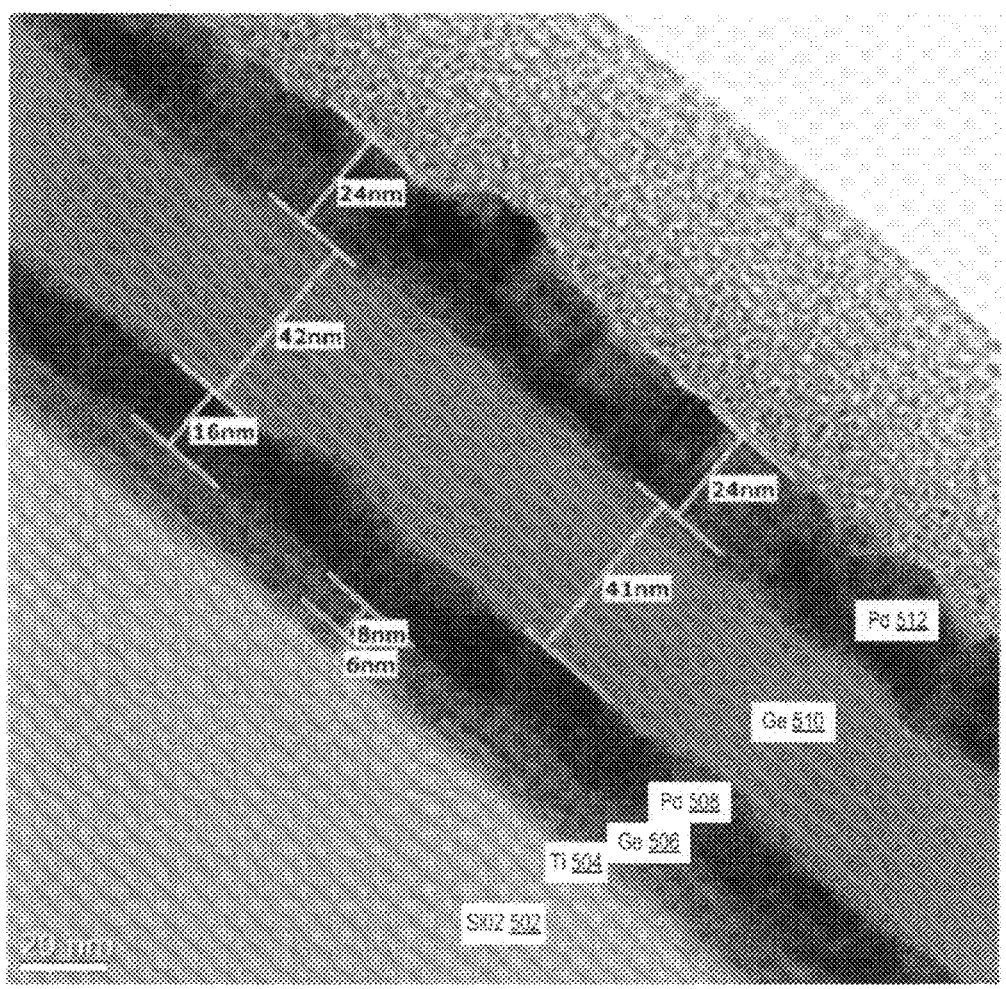
FIG. 5 illustrates a cross-section of an embodiment of a manufacture of a gold-free contact with germanium and palladium layers.

FIG. 5 illustrates a cross-section of an embodiment of a manufacture of a gold-free contact with germanium and palladium layers. Device 500 illustrates a practical implementation of device 200 of FIG. 2A. The device was scanned prior to the anneal process, to illustrate the different layers on a dummy wafer. Experimentation shows that a Pd-first metal (contact) stack has good adhesion to III-V, but poor adhesion to oxide. However, the Ge-first metal stack exhibits good adhesion to both. For implementations where adhering to oxide is not important, a Pd-first layer would work.

As mentioned above, in one embodiment, a thin layer of metal (e.g., Ti) could be used between the contact stack and the semiconductor surface, which shows good adhesion and only slightly higher Re. As shown, a 6 nm Ti layer 504 is deposited on SiO2 surface 502, followed by 8 nm of Ge 506, 16 nm of Pd 508, 52 nm of Ge 510, and 24 nm of Pd 512. The total ratio of Ge to Pd is 5:4.

While reference is made above to specific embodiments illustrated, a more general discussion follows without specific reference to figures. In one embodiment, a hybrid laser for silicon photonics uses a III-V material system based on InP to generate light, which is then coupled into a silicon waveguide. A contact in accordance with any embodiment described herein can form a low-resistance contact to the n- and p-terminals of the III-V device in a CMOS-compatible fashion. The contact metallization is not gold-based, in contrast to typical processing for III-V devices, but provides low-resistance contacts to the III-V material unlike conventional CMOS metals.

Unlike many similar III-V devices, the metallization structure or metallurgy described herein works for both n- and p-type contacts (e.g., n-InP and p-InGaAs), which minimizes process complexity. The same metal contact stack forms low-Rc contacts to both n-InP (Si-doped at $3\times10^{18}$ at/cm$^3$) and p-InGaAs (Zn-doped at $1\times10^{19}$ at/cm$^3$). The structures provided herein allow reaching target specific contact resistance (Rc) values of approximately $1\times10^{-5}$ to $6\times10^{-5}$ Ohm-cm or below.

In contrast to standard III-V metallization techniques, the described contact or contact stack uses Pd and Ge (which may be deposited in layers) to achieve low Rc without the use of gold, making it CMOS-compatible. Additionally, the described contact uses sputtering and etching rather than liftoff, which is a dirty process widely eschewed by the CMOS industry. Traditional III-V structures are often manufactured without oxide, which allows such processes to deposit metal over the entire structure surface and then use liftoff to leave the metal where it is desired. However, liftoff is not compatible with CMOS processing, and thus makes such devices incompatible with current mass-production semiconductor processing techniques.

In one embodiment, the described contact uses a standard via-through-ILD (interlayer deposition) contact structure, so that only oxide remains over the open areas of the wafer after contact patterning. As stated above, the contact described herein provides good adhesion to oxide, as well as providing a single contact metallurgy to achieve low Rc for both p- and n-type contacts.

Experimental evidence suggests that palladium reacts very well with germanium to create the stack. Similarly situated metals such as nickel (one level up on the Periodic Table from palladium) and platinum (one level down on the Periodic Table from palladium) do not react as well with germanium as the palladium. The ratio of germanium to palladium is important to provide a proper mix between good contact resistance for both p-type and n-type. Germanium is the main reason contact resistance is good for n-type materials, seeing that it increases the mobility of the electrons (n-type charge carriers). Palladium increases the mobility of holes, which lowers the contact resistance to p-type material. Thus, there needs to be a balance of Ge to Pd to be able to achieve a contact structure that works well for both n- and p-type materials.

Figure 6:
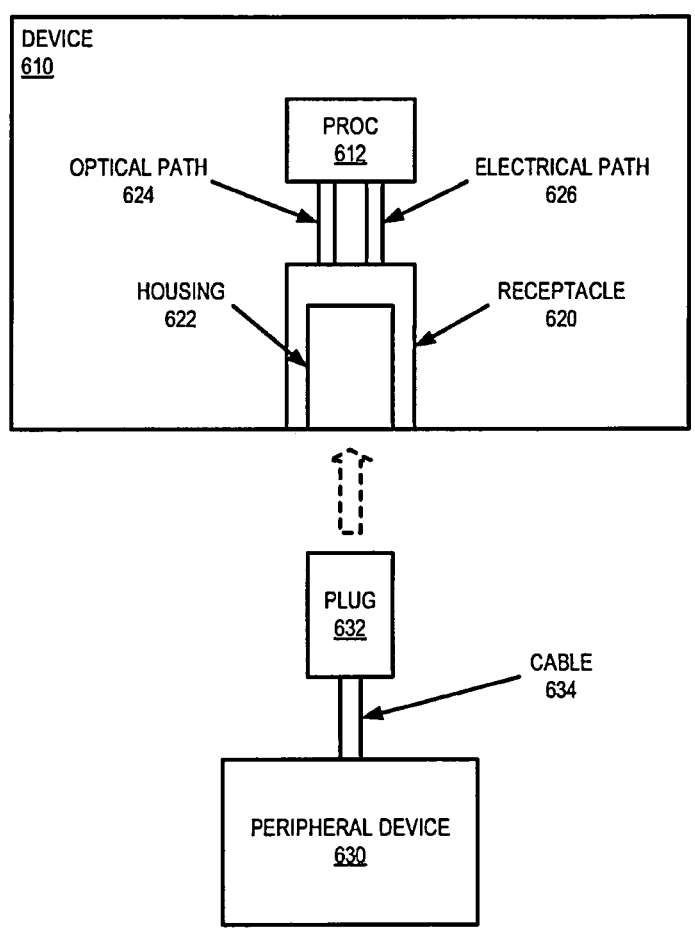
FIG. 6 is a block diagram of an embodiment of a system in which a laser with gold-free contacts could be used.

FIG. 6 is a block diagram of an embodiment of a system in which a laser with gold-free contacts could be used. System 600 includes device 610, which can include any of a number of devices, including a desktop or laptop computer, a netbook, a tablet computing device, or other such device. Device 610 can also be any type of server or high-end computing device. Besides computing devices, it will be understood that many other types of electronic devices can incorporate the one or more of the types of connector discussed herein, and the embodiments described herein would apply equally well in such electronic devices. Examples of other such electronic devices can include handheld devices, smartphones, media devices, multimedia devices, memory devices, cameras, voice recorders, I/O devices, networking devices, gaming devices, gaming consoles, or any other electronic device that might include such a connector.

Device 610 includes processor (proc) 612, which represents any type of processing component that processes electrical and/or optical signals I/O signals. Processor 612 is an abstraction, and it will be understood that a single processing device could be used, including a multi-core device, or multiple separate devices can be used. Processor 612 can include or be a microprocessor, programmable logic device or array, microcontroller, signal processor, or some combination.

Device 610 includes receptacle 620, which interfaces with plug 632. Plug 632 is a connector plug that allows peripheral device 630 (which can be any of the same types of devices discussed above) to interconnect with device 610. Plug 632 can be directly built into peripheral device 630 (with or without a cord or cable 634), or can be interconnected to peripheral device 630 via a standalone cable. In one embodiment, plug 632 supports communication via an optical interface, an electrical interface, or both.

Plug 632 mates with receptacle 620 of device 610. As used herein, mating one connector with another refers to providing a mechanical connection. The mating of one connector with another typically also provides a communication connection. Receptacle 620 includes housing 622, which provides the mechanical connection mechanisms. In one embodiment, receptacle 620 includes electrical and optical interface components. In one embodiment, receptacle 620 only supports an optical interface.

Device 610 includes optical path 624 to support the optical interfacing. Optical path 624 represents one or more components, which can include processing and/or termination components that convey an optical signal between processor 612 and receptacle 620. Conveying a signal can include the generation and converting to optical, or the receiving and converting to electrical, as described in more detail below. In an embodiment where electrical interfacing from receptacle 620 is supported in device 610, device 610 includes electrical path 626. Electrical path 626 represents one or more components that convey an electrical signal between processor 612 and receptacle 620.

It will be understood that while a portion of optical path 624 can include electrical components (especially for converting to/from electrical for processor 612), optical path 624 conveys a signal that is either received at or sent from device 610 as an optical signal. In contrast, electrical path 626 conveys a signal that is either received at or sent from device 610 as an electrical signal. Thus, optical path 624 provides a communication path for receptacle 620 as an optical interface, and electrical path 626 provides a communication path for receptacle 620 as an electrical interface.

Receptacle 620, housing 622, and optical and electrical paths (624 and 626, respectively) support the connector embodiments described above. In one embodiment, plug 632 and/or receptacle 620 include laser communication components, such as hybrid lasers manufactured with gold-free contacts as discussed herein.

Figure 7:
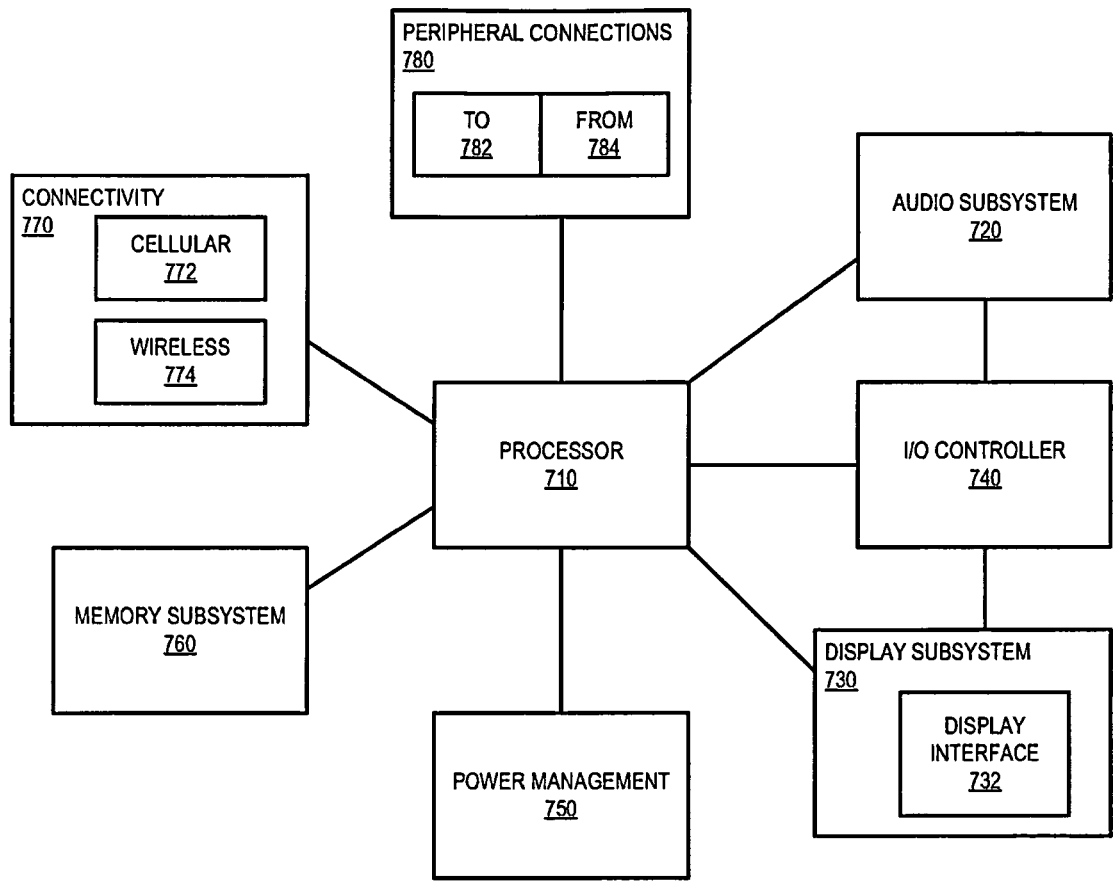
FIG. 7 is a block diagram of an embodiment of a mobile device in which a laser with gold-free contacts could be used.

FIG. 7 is a block diagram of an embodiment of a mobile device in which a laser with gold-free contacts could be used. Computing device 700 represents a mobile computing device, such as a computing tablet, a mobile phone or smartphone, a wireless-enabled e-reader, or other wireless mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations may also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, or other hardware that can be included in device 700. The input can be part of direct user interaction, as well as providing environmental input to the system to influence its operations (such as filtering for noise, adjusting displays for brightness detection, applying a flash for a camera, or other features).

In one embodiment, device 700 includes power management 750 that manages battery power usage, charging of the battery, and features related to power saving operation. Memory subsystem 760 includes memory devices for storing information in device 700. Memory can include nonvolatile (state does not change if power to the memory device is interrupted) and/or volatile (state is indeterminate if power to the memory device is interrupted) memory devices. Memory 760 can store application data, user data, music, photos, documents, or other data, as well as system data (whether long-term or temporary) related to the execution of the applications and functions of system 700.

Connectivity 770 includes hardware devices (e.g., wireless and/or wired connectors and communication hardware) and software components (e.g., drivers, protocol stacks) to enable device 700 to communicate with external devices. The device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audio-visual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, one or more peripheral connections are established via optical interconnections. When an optical interconnection is used, an optical plug and receptacle can be used. In one embodiment, as described above, the plug and/or receptacle use hybrid lasers or other circuits that have gold-free contacts.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A semiconductor device comprising:
   a semiconductor device layer;
   a first region of an n-type material, the first region disposed in or on the semiconductor device layer;
   a second region of a p-type material, the second region disposed in or on the semiconductor device layer;
   a first contact manufactured on the semiconductor device layer with a complementary metal-oxide-semiconductor (CMOS) process, wherein the first contact is disposed directly on a surface of the first region, the first contact including a first layer of a contact material including germanium (Ge) and palladium (Pd), the first layer having a ratio of Ge to Pd that provides for both p-type materials and n-type materials a contact resistivity equal to or less than $6\times10^{-5}$ Ohm-cm, wherein the ratio of Ge to Pd is within a range of approximately 1.25-2.0 parts Ge per part Pd;
   a second contact manufactured on the semiconductor device layer with the CMOS process, wherein the second contact is disposed directly on a surface of the second region, the second contact including a second layer of the contact material including Ge and Pd, the second layer having the ratio of Ge to Pd.

2. The semiconductor device of claim 1, wherein the semiconductor device layer comprises an oxide material.

3. The semiconductor device of claim 1, wherein the first layer of the contact material is in direct contact with a surface of the first region of the n-type material.

4. The semiconductor device of claim 1, wherein the second layer of the contact material is in direct contact with a surface of the second region of the p-type material.

5. The semiconductor device of claim 1, wherein the layer of material comprises a layered structure of multiple alternating layers of Ge and Pd that is annealed.

6. The semiconductor device of claim 1, wherein the layer of contact material comprises a structure formed by depositing a target material that has the ratio of Ge to Pd.

7. The semiconductor device of claim 6, wherein the layer of material comprises a structure formed by simultaneously depositing the layer of material from at least one Ge target and at least one Pd target.

8. The semiconductor device of claim 1, the first contact further comprising:
   a metal layer adjacent the semiconductor device layer, between the semiconductor device layer and the first layer of contact material.

9. The semiconductor device of claim 8, wherein the metal layer comprises a layer of titanium.

10. The semiconductor device of claim 8, wherein the metal layer comprises a layer of tungsten.

11. A semiconductor laser device comprising:
    a waveguide region of III-V semiconductor material manufactured onto a silicon substrate with a complementary metal-oxide-semiconductor (CMOS) process, the semiconductor laser device having a layer of oxide manufactured over the III-V semiconductor material, wherein the III-V semiconductor material has a first region of a p-type material exposed through the oxide and a second region of an n-type material exposed through the oxide;
    a first contact manufactured directly on the exposed first region, the first contact including a first layer of a contact material including germanium (Ge) and palladium (Pd), the first layer having a ratio of Ge to Pd that provides for both the p-type material and n-type material a contact resistivity equal to or less than $6\times10^{-5}$ Ohm-cm, wherein the ratio of Ge to Pd is within a range of approximately 1.25-2.0 parts Ge per part Pd; and
    a second contact manufactured directly on the exposed second region, the second contact including a second layer of the contact material including germanium (Ge) and palladium (Pd), the second layer having the ratio of Ge to Pd that provides a low contact resistance for both the p-type material and n-type material.

12. The semiconductor laser device of claim 11, the contact further comprising:
    a layer of metal as a bottom layer adjacent the exposed region; and
    an annealed contact stack including multiple alternating layers of germanium (Ge) and palladium (Pd) annealed into a contact material;
    wherein the layers of Ge and Pd are disposed on the layer of metal and annealed.

13. The semiconductor laser device of claim 12, wherein the contact stack is an annealed stack of alternating layers of Ge and Pd with a layer of Ge directly adjacent the layer of metal and a layer of Pd as a top layer of the stack.

14. The semiconductor laser device of claim 13, wherein the alternating layers of Ge and Pd include:
    a bottom layer of Ge having a thickness of approximately 1 unit;
    a layer of Pd having a thickness of approximately 1 unit;
    a layer of Ge having a thickness of approximately 4 units; and
    a top layer of Pd having a thickness of approximately 2 units.

15. The semiconductor laser device of claim 14, wherein 1 unit is approximately 10 nm.

* * * * *